(12) United States Patent
Wang et al.

(10) Patent No.: US 11,011,231 B2
(45) Date of Patent: May 18, 2021

(54) DATA WRITE-IN METHOD AND NON-VOLATILE MEMORY

(71) Applicant: Winbond Electronics Corp., Taichung (TW)

(72) Inventors: Ping-Kun Wang, Taichung (TW); Chang-Tsung Pai, Taichung (TW); Yu-Ting Chen, Taichung (TW); He-Hsuan Chao, Taichung (TW); Ming-Che Lin, Taichung (TW); Frederick Chen, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/849,976

(22) Filed: Apr. 15, 2020

(65) Prior Publication Data
US 2021/0074356 A1 Mar. 11, 2021

(30) Foreign Application Priority Data

Sep. 11, 2019 (TW) ................................ 108132846

(51) Int. Cl.
*G11C 11/00* (2006.01)
*G11C 13/00* (2006.01)

(52) U.S. Cl.
CPC ...... *G11C 13/0069* (2013.01); *G11C 13/0064* (2013.01); *G11C 13/0097* (2013.01); *G11C 2013/0066* (2013.01)

(58) Field of Classification Search
CPC ... G11C 3/0069; G11C 3/0064; G11C 3/0097; G11C 3/0066

USPC ........................................................ 365/148
See application file for complete search history.

(56) References Cited

U.S. PATENT DOCUMENTS

| 7,433,226 B2 | 10/2008 | Lung | |
|---|---|---|---|
| 2010/0157655 A1* | 6/2010 | Aoki ................. | G11C 13/0069 365/148 |
| 2013/0176783 A1* | 7/2013 | Senoo .................... | G11C 16/20 365/185.09 |
| 2015/0146473 A1* | 5/2015 | Hou .................... | G11C 13/0069 365/148 |
| 2018/0366197 A1 | 12/2018 | Wang et al. | |

FOREIGN PATENT DOCUMENTS

WO 2015038557 3/2015

OTHER PUBLICATIONS

Office Action of Taiwan Counterpart Application, dated Feb. 17, 2020, pp. 1-7.

\* cited by examiner

*Primary Examiner* — Vu A Le
(74) *Attorney, Agent, or Firm* — JCIPRNET

(57) ABSTRACT

A data write-in method and a non-volatile memory are provided. The data write-in method includes: providing a reset voltage to a plurality of selected memory cells according to a first flag, and recursively performing a reset process for the plurality of selected memory cells; setting a second flag according to a plurality of first verification currents of the plurality of selected memory cells; and under a condition that the second flag is set: providing a set voltage to the plurality of selected memory cells according to a resistance of the plurality of selected memory cells; and setting the first flag according to a plurality of second verification currents of the plurality of selected memory cells.

16 Claims, 4 Drawing Sheets

DATA WRITE-IN METHOD AND NON-VOLATILE MEMORY

CROSS-REFERENCE TO RELATED APPLICATION

This application claims the priority benefit of Taiwan application serial no. 108132846, filed on Sep. 11, 2019. The entirety of the above-mentioned patent application is hereby incorporated by reference herein and made a part of this specification.

BACKGROUND OF THE DISCLOSURE

Field of the Disclosure

The disclosure relates to a data write-in method and a non-volatile memory, in particular to a data write-in method for adjusting a set voltage and a reset voltage according to the physical state of a memory and a non-volatile memory.

Description of Related Art

In a non-volatile memory, the physical characteristic of the memory may degrade as the operation cycle increases. In conventional data write-in methods, during the transition period from a normal memory cell to the time before a degradation phenomenon occurs, because the physical state of the memory cannot be accurately determined, a normal write-in operation set value may be switched to a degraded write-in operation set value in advance, and at the moment, a memory write-in failure may be caused, thus reducing the reliability of the non-volatile memory data write-in operation.

SUMMARY OF THE DISCLOSURE

The disclosure provides a data write-in method and a non-volatile memory, which can determine the physical state of a memory cell, and accordingly adjust a reset voltage and a set voltage to ensure the accuracy of the data write-in state of the memory.

The data write-in method of the disclosure comprises: providing a reset voltage to a plurality of selected memory cells according to a first flag, and performing a default reset process for the selected memory cells; setting a second flag according to the statistical value of a plurality of first verification currents of the selected memory cells; and when the second flag is set to a second state, adding a default set voltage to the selected memory cells, and performing a default set process for the selected memory cells; and setting the first flag according to the statistical value of a plurality of second verification currents of the selected memory cells.

The non-volatile memory of the disclosure comprises a memory cell array and a controller. The controller is coupled to the memory cell array and configured to perform each step of the above data write-in method.

Based on the foregoing, the physical state of a memory cell can be determined by the data write-in method and the non-volatile memory, the reset voltage and the set voltage of the memory cell are adjusted accordingly, the utilization rate of the memory cell is improved, and the accuracy of the data write-in state of the memory is ensured.

In order to make the aforementioned and other objectives and advantages of the present disclosure comprehensible, embodiments accompanied with figures are described in detail below.

DESCRIPTION OF THE EMBODIMENTS

Figure 1:
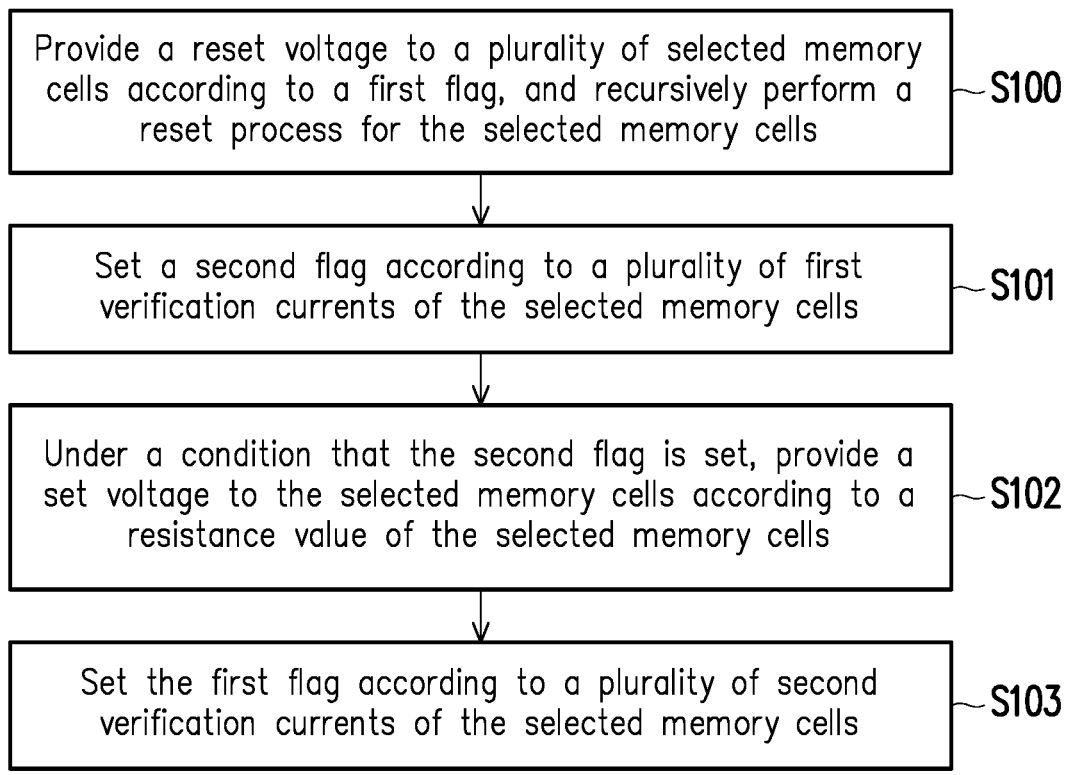
FIG. 1 is a schematic diagram of a data write-in process according to an embodiment of the disclosure.

Reference is now made to FIG. 1, which is a schematic diagram of a data write-in process according to an embodiment of the disclosure. The data write-in process may be applied to a non-volatile memory with a plurality of memory cells to control data write-in of the non-volatile memory. For example, the data write-in process shown in FIG. 1 may be applied to a resistive memory.

As shown in FIG. 1, in step S100, for a plurality of selected memory cells in the non-volatile memory, a reset voltage of the selected memory cells is determined according to a first flag of the selected memory cells, and the determined reset voltage is provided to the selected memory cells for resetting. Next, for the selected memory cells, a reset process is recursively performed. In detail, for all of the selected memory cells, a first verification current for each of the selected memory cells is measured. All of the first verification currents are respectively compared with a first threshold current, when any one of the first verification currents is not less than the first threshold current, a reset pulse is repeatedly applied and all of the first verification currents are repeatedly compared with the first threshold current, and the reset process is ended until all of the first verification currents are less than the first threshold current.

In step S101, a first statistical value is calculated according to all of the first verification currents, and a second flag of the selected memory cells is set according to the first statistical value. In detail, the first statistical value is compared with a second threshold current. When the first statistical value is greater than or equal to the second threshold current, the selected memory cells are determined to still be in a safe state, therefore, the second flag of the selected memory cells is set to a first state. Otherwise, when the first statistical value is less than the second threshold current, the selected memory cells are determined not to be in the safe state, therefore, the second flag of the selected memory cells is set to a second state. For example, the first statistical value may be an average, median, or mode of all of the first verification currents.

In step S102, a set voltage is provided to the selected memory cells for setting, and the second verification currents of all of the selected memory cells are measured. And then, the selected memory cells are set according to a default set process. In an embodiment, a set voltage of the selected memory cells may be determined according to the second flag of the selected memory cells, and the determined set voltage is provided to the selected memory cells for setting.

If the second flag of the selected memory cells is set, which indicates that the selected memory cells are not in the safe state, step S103 is further performed. In step S103, a second statistical value is calculated according to all of the second verification currents, and a first flag of the selected memory cells is set according to the second statistical value. In detail, the second statistical value is compared with a third threshold current. When the second statistical value is greater than or equal to the third threshold current, the selected memory cells are determined not to be in a degradation state (in a transition state), therefore, the first flag of the selected memory cells is set to the first state. Otherwise, when the second statistical value is less than the third threshold current, the selected memory cells are determined to have entered the degraded state, therefore, the first flag of the selected memory cells is set to the second state. For example, the second statistical value may be an average, median, or mode of all of the second verification currents.

Figure 2:
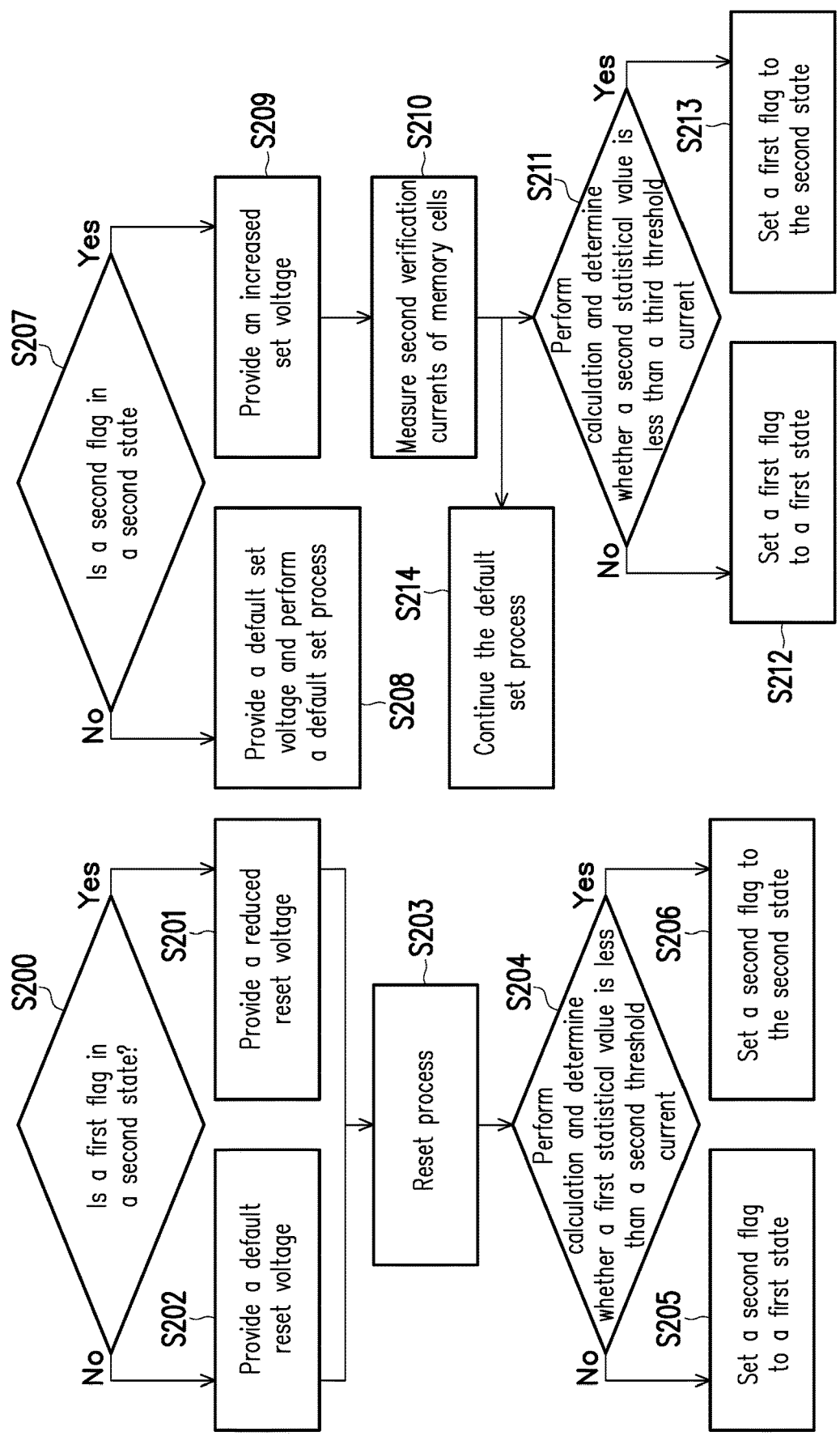
FIG. 2 is a schematic diagram of another data write-in process according to an embodiment of the disclosure.

Reference is now made to FIG. 2, which is a schematic diagram of another data write-in process according to an embodiment of the disclosure. In FIG. 2, steps S200 to S206 are processes for resetting the selected memory cells in the data write-in process, and steps S207 to S214 are processes for setting the selected memory cells in the data write-in process. In an embodiment, steps S200 to S206 are performed prior to steps S207 to S214. In an embodiment, steps S200 to S214 in the data write-in process are performed cyclically. In an embodiment, steps S200 to S206 and steps S207 to S214 are performed simultaneously.

In step S200, step S201 or step S202 is performed according to the determination of the first flag of the selected memory cells. When the first flag of the selected memory cells is the second state, the selected memory cells are in the degradation state, therefore, step S201 is performed to reduce the default reset voltage to be set as the reset voltage and the reset voltage is provided to the selected memory cells to reset the selected memory cells. When the first flag of the selected memory cells is the first state, the selected memory cells are not in the degradation state, therefore, step S202 is performed to set the default reset voltage as the reset voltage and the reset voltage is provided to the selected memory cells to reset the selected memory cells.

In the reset process of step S203, for all of the selected memory cells, the first verification current of each of the selected memory cell is measured. All of the first verification currents are respectively compared with the first threshold current. When the comparison result shows that the first verification currents of all of the selected memory cells are less than the first threshold current, the reset process is ended. When the comparison result shows that any one of the first verification currents of the selected memory cells is not less than the first threshold current, a reset pulse is provided to the selected memory cells, and a default reset process is continued.

In step S204, a second flag of the selected memory cells is set according to the first statistical value of all of the first verification currents. In detail, when the first statistical value is greater than or equal to the second threshold current, which indicates that the selected memory cells are still in the safe state, step S205 is performed to set the second flag of the selected memory cells to the first state. When the first statistical value is less than the second threshold current, which indicates that the selected memory cells are not in the safe state, step S206 is performed to set the second flag of the selected memory cells to the second state. For example, the first statistical value may be an average, median, or mode of all of the first verification currents.

In step S207, step S208 or step S209 is performed according to the determination of the second flag of the selected memory cells. When the second flag of the selected memory cells is not the second state, the selected memory cells are in the safe state, therefore, step S208 is performed to set the default set voltage as the set voltage and the set voltage is provided to the selected memory cells to set the selected memory cells. When the second flag of the selected memory cells is the second state, the selected memory cells are not in the safe state, therefore, step S209 is performed to increase the default set voltage to set the default set voltage as the set voltage and the set voltage is provided to the selected memory cells to set the selected memory cells.

In an embodiment of the disclosure, in step S209, the voltage value of the set voltage may be increased according to the electrical state of the selected memory cells. For example, in an embodiment, the verification currents flowing through the selected memory cells may be measured first to calculate the resistance value of the selected memory cells, a set voltage difference value can be obtained by querying a look-up table as shown in Table 1 below according to the resistance value of the selected memory cells, the obtained set voltage difference value is summed with the default set voltage to obtain a value to be set as the set voltage, and the set voltage is provided to the selected memory cells to set the selected memory cells. In other embodiments, when the reset process is completed, the set voltage difference value corresponding to the currents or resistance value of the selected memory cells may be queried directly and recorded in the memory, and the recorded value is directly read to adjust the set voltage in step S209.

TABLE 1

Look-up Table

| Resistance Value (millions of Ohms) | Set Voltage Difference Value (volts) |
|---|---|
| 2-2.6 | 0.1 |
| 2.7-3.3 | 0.2 |
| 3.4-4 | 0.3 |
| 4.1-4.7 | 0.4 |
| 4.8-5.4 | 0.5 |
| 5.5-6.1 | 0.6 |

In step S210, for all of the selected memory cells, the second verification current for each of the selected memory cell is measured. Next, steps S214 and S211 are respectively performed. In step S214, the non-volatile memory continues with a default set process to set the selected memory cells. For example, the non-volatile memory then respectively compares all of the second verification currents of the selected memory cells with a fourth threshold current. When the comparison result shows that the second verification currents of all of the memory cells are greater than the fourth threshold current, the set process is ended. When the comparison result shows that any one of the second verification currents of the memory cells is not greater than the fourth threshold current, a set pulse is provided to the selected memory cells and the set process is continued.

In step S211, the first flag of the selected memory cells is set according to the second statistical value of all of the second verification currents. When the second statistical value is greater than or equal to the third threshold current, the selected memory cells are determined not to be in the degraded state (in the transition state), therefore, step S212 is performed to set the first flag of the selected memory cells to the first state. When the second statistical value is less than the third threshold current, the selected memory cells are determined to be in the degraded state, therefore, step S213 is performed to set the first flag of the selected memory cells to the second state. For example, the second statistical value may be an average, median, or mode of all of the first verification currents.

In short, when the memory cells are not in the safe state, the data write-in process of the disclosure can determine whether the physical state of the selected memory cells really enters the degraded state or not, and accordingly adjust the set voltage and the reset voltage provided for the selected memory cells. Therefore, the data write-in process of the disclosure does not erroneously determine the degraded state of the non-volatile memory, the set voltage and the reset voltage can be effectively adjusted, therefore, the utilization rate of the memory cells is improved and the on-off ratio of the memory cells is increased.

Figure 3:
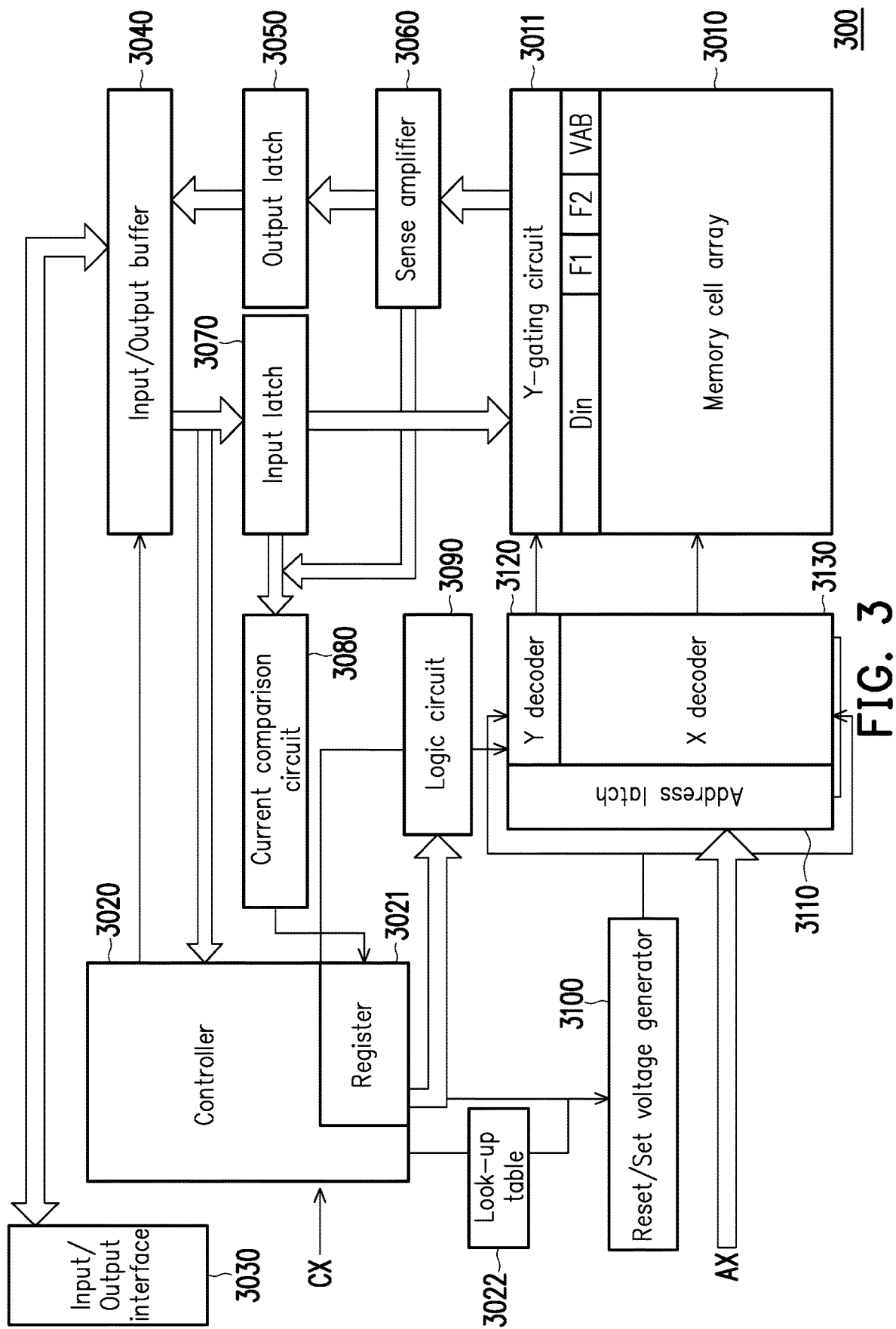
FIG. 3 is a block diagram of a non-volatile memory according to an embodiment of the disclosure.

Reference is now made to FIG. 3, which is a block diagram of a non-volatile memory according to an embodiment of the disclosure. A non-volatile memory 300 comprises a memory cell array 3010, a Y gating circuit 3011, a controller 3020, a register 3021, a look-up table 3022, an input/output interface 3030, an input/output buffer 3040, an output latch 3050, a sense amplifier 3060, an input latch 3070, a current comparison circuit 3080, a logic circuit 3090, a reset/set voltage generator 3100, an address latch 3110, a Y decoder 3120, and an X decoder 3130.

The controller 3020 is configured to receive a control signal CX and perform write-in and read-out operations of the memory cell array 3010 according to the control signal CX.

The address latch 3110 is configured to receive address information AX, decode the address information AX through the Y decoder 3120 and the X decoder 3130, and generate a two-dimensional access address for accessing the memory cells in the memory cell array 3010.

The input/output interface 3030 is configured to serve as an external signal transmission interface of the non-volatile memory 300. The input/output buffer 3040 is configured to temporarily store the read data read by the memory cell array 3010 or written data to be written to the memory cell array 3010. The input latch 3070 is configured to latch the written data. The output latch 3050 is configured to latch the read data.

The sense amplifier 3060 is configured to compare the first verification current of the memory cell array 3010 with the first threshold current, and to compare the second verification current of the memory cell array 3010 with the fourth threshold current. Accordingly, the controller 3020 can determine whether the reset operation and the set operation are successful or not according to the sense amplifier 3060.

The current comparison circuit 3080 is configured to compare the first statistical value of the memory cell array 3010 with the second threshold current, and to compare the second statistical value of the memory cell array 3010 with the third threshold current. Accordingly, the controller 3020 can set a second flag F2 and a first flag F1 of the selected memory cells according to the current comparison circuit 3080.

In addition, the memory cell array 3010 stores a plurality of data, the first flag F1, the second flag F2, and a voltage adjustment bit (VAB). Therefore, the non-volatile memory 300 can adjust the reset voltage according to the first flag F1, and adjust the set voltage according to the second flag F2 and the VAB, so that a write-in operation can be performed adaptively according to the physical state of the memory cells.

In an embodiment, when a write-in operation is performed, the controller 3020 can first load a plurality of data, the first flag F1, the second flag F2 and the VAB, corresponding to the selected memory cells, into the register 3021. Next, the controller 3020 can instruct the reset/set voltage generator 3100 to generate the reset voltage according to the first flag F1 in the register 3021, or search the look-up table 3022 according to the second flag F2 and the VAB in the register 3021 to instruct the reset/set voltage generator 3100 to generate the set voltage.

Figure 4:
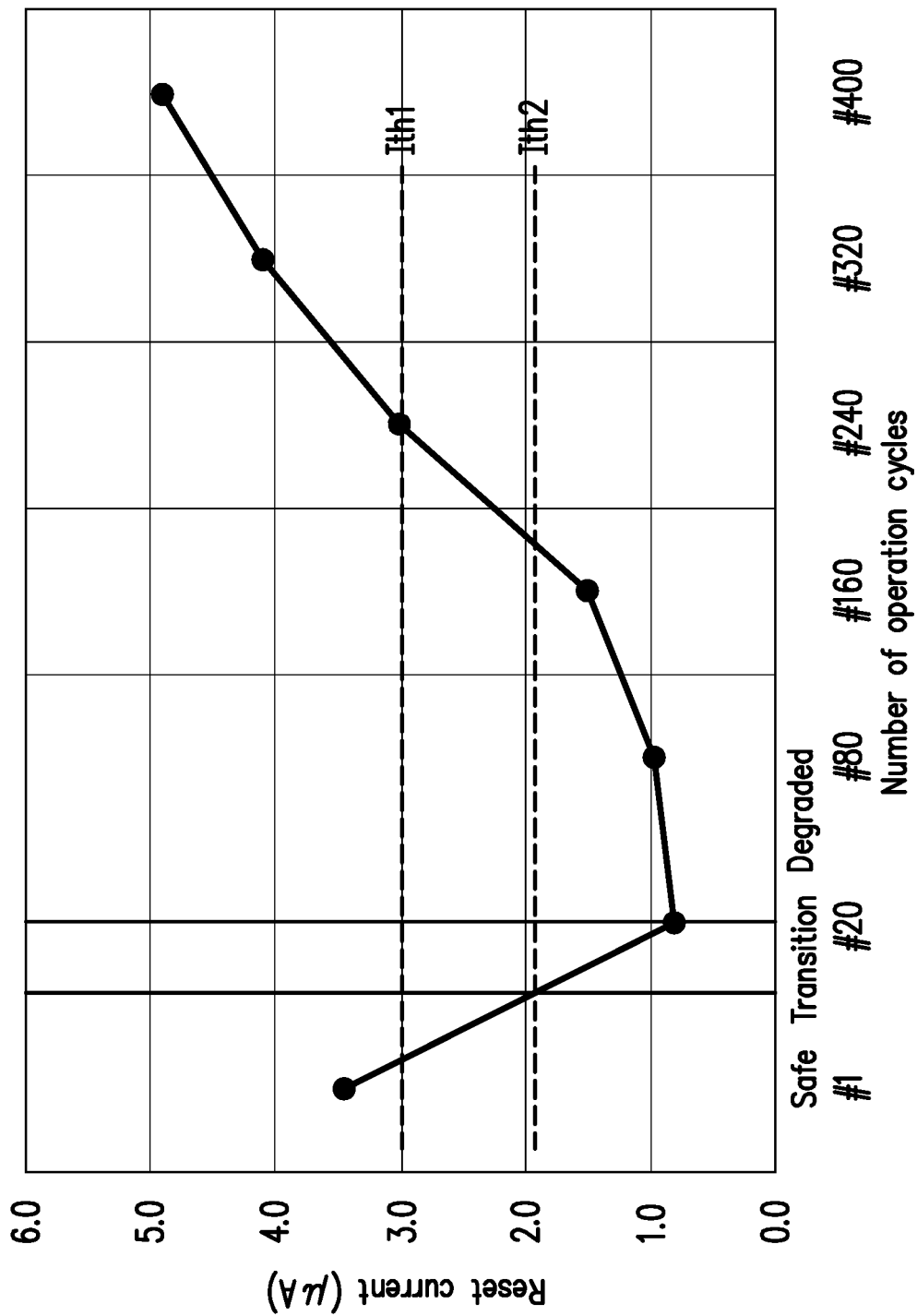
FIG. 4 is a graph showing the relationship between a reset current and the number of operation cycles according to an embodiment of the disclosure.

FIG. 4 is a graph showing the relationship between a first verification current and the number of operation cycles of a general resistive memory cell. Referring to FIG. 4, when the number of initial operation cycles is small, the memory cell is still in a safe state, the first verification current of the memory cell is between the first threshold current and the second threshold current, and the memory cell can normally operate at the time. As the operation cycles increase, when the first verification current of the memory cell starts to be lower than the second threshold current, the memory cell enters a transition state, at this time, the memory cell occasionally shows a phenomenon of pseudo-degradation, but normal operation can be restored by increasing the set voltage once. After that, as the operation cycles of the memory cell further increase, the memory cell actually enters a degradation state, and the memory cell can be correctly written in only by normally reducing the reset voltage and increasing the set voltage.

This is described below with reference to FIG. 2 and FIG. 4. In step S203, the data write-in method of the disclosure continues with the reset process until each memory cell is reset successfully (i.e., the first verification currents are less than the first threshold current Ith1). In step S204, the first statistical value is calculated according to the first verification currents of all of the selected memory cells, and the first statistical value is compared with the second threshold current Ith2 accordingly to determine whether the memory cells are still in the safe state so as to set the state of the second flag. In step S210, when the memory cells are not in the safe state (i.e., the second flag is set to the second state), the second statistical value is calculated according to the second verification currents of all of the selected memory cells, and the second statistical value is compared with the third threshold current accordingly to determine whether the memory cells are in the transition state or have entered the degraded state.

Therefore, according to the data write-in method of the disclosure, whether the second flag is set to the second state or not is determined by comparing the first statistical value with the second threshold current of the memory cells, and whether the first flag is set to the second state or not is determined by comparing the second statistical value with the third threshold current of the memory cells, so that the memory cells are determined to be in the safe state, the transition state or the degradation state. Therefore, according to the data write-in method of the disclosure, the reset voltage can be adjusted according to the first flag during resetting, and the set voltage can be adjusted according to the second flag during setting, so that the non-volatile memory can adjust the reset voltage and the set voltage according to the physical state of the memory cells, and the utilization rate and the on-off ratio of the memory cells are effectively increased.

Based on the above, the data write-in method and the non-volatile memory of the disclosure can effectively determine the non-volatile memory is in the transition state or the degradation state, and adjust the set voltage and the reset voltage through the second flag and the first flag. Therefore, the data write-in method and the non-volatile memory of the disclosure can adjust the reset voltage and the set voltage according to the physical state of the memory cells, thereby effectively increasing the utilization rate of the memory cells and ensuring the accuracy of the data writing state of the memory.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A data write-in method, adapted to a non-volatile memory and comprising:
providing a reset voltage to a plurality of selected memory cells according to a first flag, and recursively performing a reset process for the selected memory cells;
setting a second flag according to a plurality of first verification currents of the selected memory cells; and
under a condition that the second flag is set:
providing a set voltage to the selected memory cells according to a resistance value of the selected memory cells; and
setting the first flag according to a plurality of second verification currents of the selected memory cells.

2. The data write-in method according to claim 1, wherein the step of providing the reset voltage to the selected cells according to the first flag comprises:
when the first flag is in a first state, setting a default reset voltage as the reset voltage; and
when the first flag is in a second state, reducing the default reset voltage to generate the reset voltage.

3. The data write-in method according to claim 1, wherein the reset process comprises:
comparing the first verification currents with a first threshold current;
when any one of the first verification currents of the selected memory cells is not less than the first threshold current, providing a reset pulse to the memory cells, and repeating the reset process; and
when all of the first verification currents of the selected memory cells are less than the first threshold current, ending the reset process.

4. The data write-in method according to claim 1, wherein the step of setting the second flag according to the first verification currents of the selected memory cells comprises:
comparing a statistical value of the first verification currents with a second threshold current;
when the statistical value of the first verification currents is greater than the second threshold current, setting the second flag to a first state; and
when the statistical value of the first verification currents is not greater than the second threshold current, setting the second flag to a second state.

5. The data write-in method according to claim 1, wherein the step of providing the set voltage to the selected memory cells according to the resistance value of the selected memory cells comprises:
querying a conversion table according to the resistance value to obtain a set voltage difference, and summing the set voltage difference with a default set voltage to set the summed voltage as the set voltage.

6. The data write-in method according to claim 1, wherein the step of setting the first flag according to the second verification currents of the selected memory cells comprises:
comparing a statistical value of the second verification currents with a third threshold current;
when the statistical value of the second verification currents is greater than the third threshold current, setting the first flag to a first state; and
when the statistical value of the second verification currents is not greater than the third threshold current, setting the first flag to a second state.

7. The data write-in method according to claim 1, wherein when the second flag is in a first state:
setting a default set voltage as the set voltage to provide the set voltage to the selected memory cells.

8. The data write-in method according to claim 1, further comprising a set process when the second flag is in a first state or a second state, wherein the set process comprises:
comparing the second verification currents with a fourth threshold current;
when any one of the second verification currents of the selected memory cells is not greater than the fourth threshold current, providing a set pulse to the memory cells, and repeating the set process; and
when all of the second verification currents of the selected memory cells are greater than the fourth threshold current, ending the set process.

9. A non-volatile memory, comprising:
a memory cell array, having a plurality of memory cells; and
a controller, coupled to the memory cell array and configured to:
provide a reset voltage to a plurality of selected memory cells according to a first flag, and recursively perform a reset process for the selected memory cells;
set a second flag according to a plurality of first verification currents of the selected memory cells; and
when the second flag is set to a second state:
provide a set voltage to the selected memory cells according to a resistance value of the selected memory cells; and
set the first flag according to a plurality of second verification currents of the selected memory cells.

10. The non-volatile memory according to claim 9, wherein the controller is further configured to perform the following steps to provide the reset voltage to the selected memory cells according to the first flag:
when the first flag is in a first state, setting a default reset voltage as the reset voltage; and
when the first flag is in a second state, reducing the default reset voltage to generate the reset voltage.

11. The non-volatile memory according to claim 9, wherein the controller is further configured to perform the following steps to perform the reset process:
comparing the first verification currents with a first threshold current;
when any one of the first verification currents of the selected memory cells is not less than the first threshold current, providing a reset pulse to the memory cells, and repeating the reset process; and
when all of the first verification currents of the selected memory cells are less than the first threshold current, ending the reset process.

12. The non-volatile memory according to claim 9, wherein the controller is further configured to perform the following steps to set the second flag according to the first verification currents of the selected memory cells:
comparing a statistical value of the first verification currents with a second threshold current;

when the statistical value of the first verification currents is greater than the second threshold current, setting the second flag to a first state; and when the statistical value of the first verification currents is not greater than the second threshold current, setting the second flag to a second state.

13. The non-volatile memory according to claim 9, wherein the controller is further configured to perform the following step to provide the set voltage to the selected memory cells according to the resistance value of the selected memory cells:

querying a conversion table according to the resistance value to obtain a set voltage difference, and summing the set voltage difference with a default set voltage to set the summed voltage as the set voltage.

14. The non-volatile memory according to claim 9, wherein the controller is further configured to perform the following steps to set the first flag according to the second verification currents of the selected memory cells:

comparing a statistical value of the second verification currents with a third threshold current;

when the statistical value of the second verification currents is greater than the third threshold current, setting the first flag to a first state; and when the statistical value of the second verification currents is not greater than the third threshold current, setting the first flag to a second state.

15. The non-volatile memory according to claim 9, wherein under a condition that the second flag is not set, the controller further performs the following step:

setting a default set voltage as the set voltage to provide the set voltage to the selected memory cells.

16. The non-volatile memory according to claim 9, wherein when the second flag is in a first state or a second state, the controller is further configured to perform the following steps to perform a set process:

comparing the second verification currents with a fourth threshold current;

when any one of the second verification currents of the selected memory cells is not greater than the fourth threshold current, providing a set pulse to the memory cells, and repeating the set process; and when all of the second verification currents of the selected memory cells are greater than the fourth threshold current, ending the set process.

* * * * *